United States Patent [19]

Kubota

[11] Patent Number: 5,173,915
[45] Date of Patent: Dec. 22, 1992

[54] SEMICONDUCTOR LASER DEVICE

[75] Inventor: Masayuki Kubota, Itami, Japan

[73] Assignee: Mitsubishi Denki Kabushiki Kaisha, Japan

[21] Appl. No.: 724,771

[22] Filed: Jul. 2, 1991

[30] Foreign Application Priority Data

Oct. 8, 1990 [JP] Japan .................. 2-270737

[51] Int. Cl.$^5$ .................. H01S 3/19; G02B 6/12
[52] U.S. Cl. .................. 372/50; 385/129; 385/130; 385/131; 385/7; 385/37
[58] Field of Search .................. 372/50, 96, 99, 102; 385/129, 150, 131, 132, 37, 7, 8

[56] References Cited

U.S. PATENT DOCUMENTS

| | | | |
|---|---|---|---|
| 4,274,706 | 6/1981 | Tangonan | 385/130 |
| 4,707,835 | 11/1987 | Mocker | 372/20 |
| 4,776,661 | 10/1988 | Handa | 385/37 |
| 4,793,675 | 12/1988 | Handa | 385/129 |
| 4,861,128 | 8/1989 | Ishikawa et al. | 385/129 |
| 4,937,808 | 6/1990 | Shimada et al. | 385/130 |
| 5,003,550 | 3/1991 | Welch et al. | 372/50 |
| 5,016,253 | 5/1991 | Kubota | 372/50 |
| 5,050,488 | 12/1991 | Fukushima et al. | 385/37 |
| 5,083,856 | 1/1992 | Hatori et al. | 385/7 |
| 5,101,297 | 3/1992 | Yoshida et al. | 385/129 |

FOREIGN PATENT DOCUMENTS

| | | |
|---|---|---|
| 0217332 | 4/1987 | European Pat. Off. . |
| 0370739 | 5/1990 | European Pat. Off. . |
| 0142621 | 9/1982 | Japan .................. 385/7 |
| 60-229890 | 10/1987 | Japan . |

OTHER PUBLICATIONS

Lean et al, "Thin-Film Acoustooptic Devices", Proceedings of the IEEE, vol. 64, No. 5, May 1976, pp. 779-788.

Murakami et al, "Wide Tunable Wavelength and Narrow Linewidth Laser Diode Using External Grating", Institute of Electronics and Communication Engineers of Japan, 1988.

Chang et al, "Fresnel Lenses in Optical Waveguides", IEEE Journal of Quantum Electronics, vol. QE-16, No. 7, Jul. 1980, pp. 744-753.

Gurov et al., "Electronic frequency tuning in a semiconductor laser with an external resonator", Nov. 1987, pp. 1352-1353.

Primary Examiner—Georgia Y. Epps
Attorney, Agent, or Firm—Leydig, Voit & Mayer

[57] ABSTRACT

A variable wavelength light source using a semiconductor laser element suitable for use in optical communications is provided. Light emitted from one end surface of the semiconductor laser element is led along a path through a light wavefront converting element (e.g., a Fresnel lens) and a spatial light modulating element which are both formed in a waveguide layer, to a diffraction grating which is also formed in the waveguide layer. Light reflected from the diffraction grating is caused to travel back along the same path but in the opposite direction and to impinge on the semiconductor laser element. Wavelength selection of by the spatial light modulating element and the diffraction grating is utilized for generating and maintaining oscillation at a selected wavelength in the laser element. The wavelength of light is selected by selecting the wavelength of a surface acoustic wave generated the spatial light modulating element, i.e., by changing the frequency of a high frequency electrical signal applied to the modulating element.

17 Claims, 1 Drawing Sheet

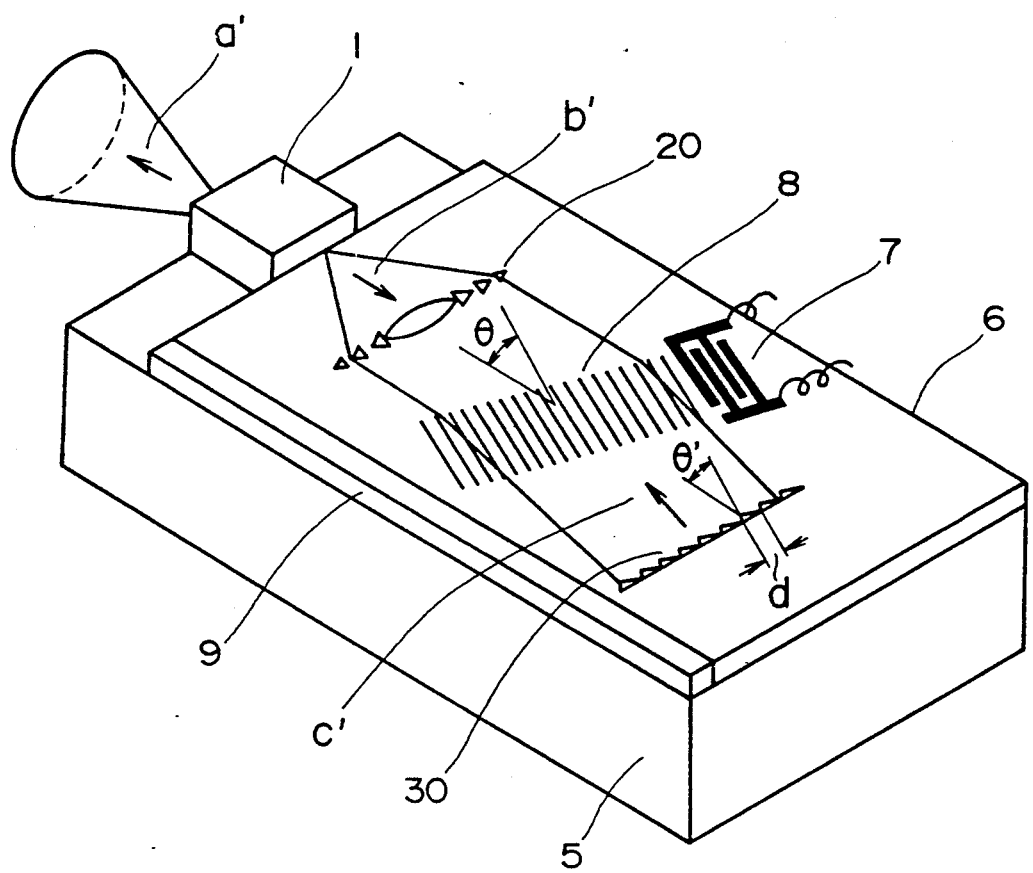
F I G. 2

SEMICONDUCTOR LASER DEVICE

This invention relates to a variable wavelength light source for use in optical communications system, and, more particularly, to a semiconductor laser device usuable as such a light source.

BACKGROUND OF THE INVENTION

One of conventional variable wavelength light source for optical communications system is a variable wavelength semiconductor laser device with an external resonator, such as the one disclosed in an article "Wide Tunable Wavelength and Narrow Linewidth Laser Diode Using External Grating" by Murakami et al. in the collections of articles presented at the 1988 Spring Conference of the Institute of Electronics and Communication Engineers of Japan.

FIG. 1 shows a basic arrangement of such a variable wavelength semiconductor laser device with an external resonator, which comprises a semiconductor laser element 1 which emits a light beam a from its front end surface and also a light beam b from its rear end surface. A collimator lens 2 collimates the light beam b. A diffraction grating 3 receives the collimated beam and reflects it. A stepping motor 4 rotates the diffraction grating 3 to alter the angle of the diffraction grating 3 relative to the incident collimated beam. The letter "c" denotes diffracted light produced by the diffraction grating 3.

In operation, the beam b emitted from the rear end surface of the semiconductor laser element 1 is incident on the collimator lens 2 in the form of a divergent light beam having divergence angle of about 10°–45° at intensities one-half the maximum intensity. The collimator lens 2 collimates the wavefront of the beam, and a collimated beam enters into the diffraction grating 3. When the collimated beam is incident on the diffraction grating 3, the grating 3 produces diffracted light. As is well known, there is predetermined relationship among the pitch of the grating, the wavelength of light, the incident angle of light, and the exiting angle of light. The exiting angle of diffracted light differs depending on the wavelength of incident light. Accordingly, by properly determining the above-described various conditions, such as the grating pitch and the incident angle of light, a light beam of desired wavelength selected from a plurality of incident light beams having different wavelengths can be selectively reflected back in the opposite direction to the incident light beam. This fact can be advantageously utilized. By rotating the diffraction grating 3 by means of the stepping motor 4, the angle of incidence of the light beam b onto the diffraction grating 3 can be varied so that a diffracted light beam c of a desired wavelength is selected by the diffraction grating 3 and reflected back in a direction 180° opposite to the incident direction. The reflected diffracted light c passes the collimator lens 2 which changes the light c into a convergent beam incident on the rear end surface of the semiconductor laser element 1 (from which the beam b emerges). The beam c enters into a resonator of the semiconductor laser element 1 through this rear end surface which is provided with an anti-reflection coating so as to have a reflectance of 1% or less. The diffracted light c has a particular wavelength selected by the diffraction grating 3. Accordingly, light which has this selected wavelength is amplified by the resonator and oscillations at this single wavelength occur. Thus, the light beam a emerging from the front end surface of the semiconductor element has this selected wavelength. The wavelength of the light beam a can be changed by rotating the diffraction grating 3 by means of the stepping motor 4 to thereby change the angle of incidence of the beam b onto the grating 3.

The above-described conventional variable wavelength semiconductor laser device with an external resonator, therefore, requires a stepping motor and a power transmission system therefor, and, furthermore, the stepping motor and the power transmission system therefor require high precision. Accordingly, the conventional device has disadvantages that it is complicated in structure, large in size, and expensive.

Japanese Published Patent Application No. SHO 62-229890 discloses another type of variable wavelength light source device which comprises a combination of a semiconductor laser element and an ultrasonic wave deflector formed in a acousto-optical medium. In this device, output light from the laser element is collimated before it enters the ultrasonic wave deflector, and light emerging from the deflector at an angle which satisfies the Bragg condition is reflected by a planar reflector or an end surface of an optical fiber so as to travel back along the incidence path, but in the opposite direction from the incidence path, to the laser element. Thus, oscillation at a particular wavelength is sustained in the laser, and output light at this particular wavelength is derived. Selection or changing of the wavelength is made through selecting and changing the wavelength of ultrasonic waves in the ultrasonic wave deflector.

The device of this type does not include a mechanical driving member, and light at a particular wavelength can be selectively generated through electrical control of the device. However, the precision in selecting a desired wavelength is not satisfactory.

The present invention has been made to eliminate the above-described disadvantages. According to the present invention, a semiconductor laser device is free of any mechanical member for driving a diffraction grating which would otherwise be required for changing the oscillation wavelength of a semiconductor laser element and the oscillation wavelength can be selected electrically with improved precision. Thus, the device as a whole is simplified in structure and reduced in size. Further, the oscillation wavelength can be selected with high precision.

SUMMARY OF THE INVENTION

In a semiconductor laser device according to the present invention, light emitted from a rear end surface of a semiconductor laser element is led in a waveguide layer to a wavefront converting element in the waveguide layer to form a parallel beam. The wavefront converted light beam is then guided through a spatial light modulating element so that the light emerges from the spatial light modulating element at a controlled angle of emergence. The emerging light then impinges on a diffraction grating which provides the desired diffraction. Diffracted light of a particular wavelength is sent back to the spatial light modulating element and then to the light wavefront converting element. The wavefront converted diffracted light then impinges onto the rear end surface of the semiconductor laser element.

The spatial light modulating element used in the device of the present invention electrically changes the angle of emergence of a light beam emitted from the semiconductor laser element and collimated by the light wavefront converting element, so that the angle of incidence of the beam incident on the diffraction grating is varied. Thus, the wavelength of the diffracted light sent back from the diffraction grating to the semiconductor laser device can be selectively varied.

BRIEF DESCRIPTION OF THE DRAWINGS

FIG. 2 is a perspective view of a semiconductor laser device according to one embodiment of the present invention.

DESCRIPTION OF EMBODIMENT

Figure 1:
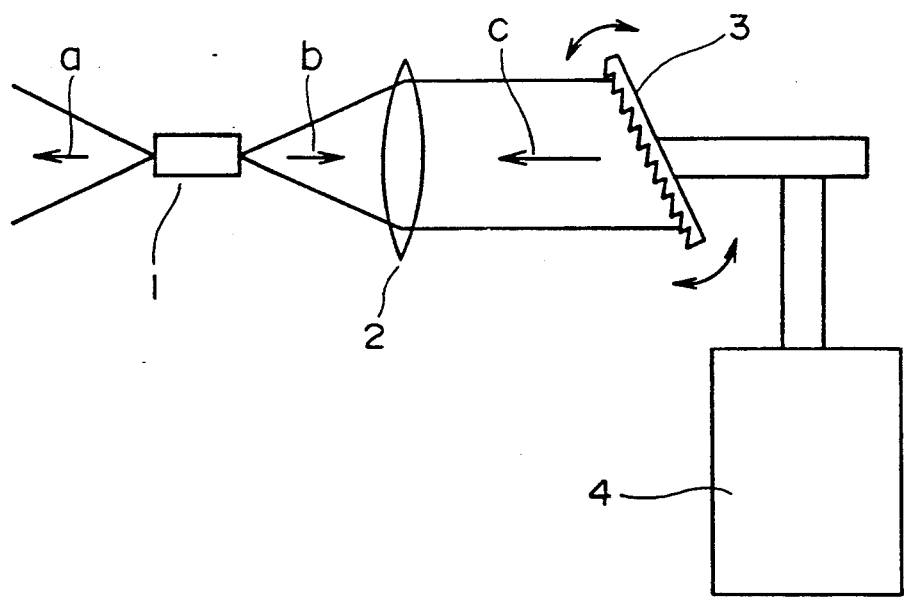
FIG. 1 is a perspective view of a basic structure of a conventional variable wavelength semiconductor laser with an external resonator.

Now, the present invention is described by means of one embodiment illustrated in the drawings.

In FIG. 2, 1 is a semiconductor laser element comprising, for example, GaInAsP materials. a' denotes a light beam emerging from the front end surface of the semiconductor laser element 1. 5 denotes a substrate of a piezoelectric material, such as lithium niobate (LiNbO$_3$). The semiconductor element 1 is supported on one major surface of the substrate 5 and is located near one end surface of the substrate 5. 6 denotes a waveguide layer formed on the substrate 5, which comprises a piezoelectric material, such as LiNbO$_3$ into which titanium (Ti) has been diffused. One end surface of the waveguide layer 6 abuts the rear end surface of the semiconductor laser element 1. b' denotes a light beam emerging from the rear end surface of the semiconductor element 1 and incident on the abutting end surface of the waveguide layer 6. The light beam b' is guided to a Fresnel lens 20 in the waveguide layer 6. The Fresnel lens 20 forms a light wavefront converting element which converts the incident divergent beam b' into a parallel beam. The Fresnel lens may be formed by etching away portions of the waveguide layer 6 so as to form a plurality of openings therein. As the light wavefront converting element, members other than a Fresnel lens may be used. For example, a geodesic lens may be formed by diffusing an impurity into the waveguide layer 6 or by depositing a different material in a particular pattern on the surface of the waveguide layer 6. Fresnel lenses and geodesic lenses in a waveguide layer are disclosed, for example, in an article "Fresnel Lenses in Optical Waveguides" by William S. C. Chang and Paul R. Ashley in *IEEE Journal of Quantum Electronics*, Vol. QE-16, No. 7, July 1980, pp. 744–753.

7 denotes a surface acoustic wave (SAW) transducer on the waveguide layer 6, which comprises a pair of interdigitated metal electrodes formed by vapor deposition. A high frequency electrical signal is applied between the two electrodes from a high frequency source (not shown) to electrically control the frequency of a SAW. 8 denotes a surface acoustic wave generated in the waveguide layer 6 by the SAW transducer 7, and its wavefront is indicated by a number of parallel lines. The portion of the waveguide layer 6 through which the SAW is propagates acts as a spatial light modulating element. Such a spatial light modulating element is disclosed in the previously cited Murakami et al article and in an article "Thin-Film Acoustooptic Devices" by E. G. H. Lean and C. D. W. Wilkinson in *Proceedings of the IEEE*, Vol. 64, No. 5, May 1976, pp. 779–788.

9 denotes an ultrasonic wave absorber which absorbs the SAW generated by the transducer 7 to prevent its reflection. A diffraction grating 30 is disposed in the waveguide layer 6 and may be a blazed grating. The blazed grating may be formed by etching away portions of the waveguide layer 6 to form an array of sawtooth-shaped openings.

In operation, the beam b' emitted by the semiconductor laser element 1 emerging from the rear end surface of the laser element 1 enters into the waveguide layer 6 from the abutting end surface and travels in the form of a diverging beam to the Fresnel lens 20. The wavefront of the beam b' is collimated by the Fresnel lens 20 into a parallel beam. The collimated beam enters into the SAW 8 generated by the SAW transducer 7. The propagation of the SAW 8 mechanically distorts the waveguide layer 6, so that the index of refraction of the waveguide layer 6 periodically varies due to the photoelastic effect, which effectively forms a refractive index modulating grating (diffraction grating) within the waveguide layer. When the light beam b' enters into this diffraction grating at an angle which satisfies the Bragg condition, single wavelength diffracted light is produced. The emerging angle $\theta$ of the diffracted light (which is equal to the incident angle of the beam b') is expressed as:

$$\theta \simeq (\lambda/Ne) \cdot v \cdot f$$

where $\lambda$ is the wavelength of light, f is the frequency of the SAW, v is the phase velocity, and Ne is the refractive index of the waveguide layer. Thus, the emerging angle $\theta$ is approximately proportional to the frequency of the SAW. Emerging angle $\theta$ of the diffracted light emerging from the SAW 8 can be changed by changing the frequency of the SAW 8 i.e., by changing the frequency of the high frequency electrical signal applied to the SAW transducer 7. Thus, the SAW 8 provides spatial light modulation.

The beam b', the direction of travel of which has been changed and which emerges from the SAW 8, propagates in the waveguide layer 6 and impinges on the diffraction grating 30, which generates diffracted light c'. As previously stated with respect to conventional techniques, by virtue of its wavelength selecting capability, the diffraction grating 30 can send back diffracted light c', which has a single wavelength determined by the incident beam, along the path of the light beam b', but in the opposite direction from the incident beam. The wavelength of the diffracted light c' varies depending on the angle of incidence of the beam b' on the diffraction grating 30. Specifically, when the wavelength of light is $\lambda$, the angle of incidence of the light onto the diffraction grating is $\theta'$, the pitch of the diffraction grating is d, and the index of refraction of the waveguide layer is Ne, there is the following relationship.

$$d \cdot \sin \theta = \lambda/2Ne$$

Thus, light of a desired wavelength can be selected by changing the frequency of the SAW 8 to thereby change the angle of incidence $\theta'$ of the light beam b' with respect to the diffraction grating 30, which, in turn, changes the wavelength of the diffracted light c'.

The diffracted light c' having the thus selected wavelength passes through the SAW 8 with predetermined incident and emerging angles, and is converted by the Fresnel lens 20 into a convergent beam which is incident on the rear end surface of the semiconductor laser element 1. Thus, laser oscillations at the selected wavelength are generated and sustained in the semiconductor laser element 1, whereby an intense beam a' at the selected wavelength is emitted from the front end surface 5 of the semiconductor laser element 1.

As described above in detail, the semiconductor laser device according to the present invention employs a combination of an spatial light modulating element and a diffraction grating., in which the incidence of an incident light beam on the diffraction grating is electrically varied by means of the spatial light modulating element. Accordingly, there is no need to use any mechanical driving arrangement to rotate the diffraction grating as in the conventional device, so that the device can be simplified in structure and is small in size.

Furthermore, because both the spatial light modulating element and the diffraction grating have a wavelength selection capability, wavelength selection is highly precise.

What is claimed is:

1. A semiconductor laser device comprising:
a substrate;
a semiconductor laser element producing an output light beam and a rear surface light beam;
a waveguide layer disposed on said substrate for receiving and propagating the rear surface light beam emitted from said semiconductor laser element;
a light wavefront converting element for collimating the rear surface light beam;
a spatial light modulating element for modulating the rear surface light beam in response to a high frequency electrical signal;
a diffraction grating for diffracting the rear surface light beam toward said spatial light modulating element, said light wavefront converting element, said spatial light modulating element, and said diffraction grating being disposed and arranged within said waveguide layer for directing a light beam of selected wavelength from the rear surface light beam diffracted from said diffraction grating through said spatial light modulating element and said light wavelength converting element onto said semiconductor laser element whereby the wavelength of the output light beam of said semiconductor laser element is controlled by a high frequency electrical signal applied to said spatial light modulating element.

2. A semiconductor laser device comprising:
a substrate;
a semiconductor laser element having opposed front end and rear end surfaces;
a waveguide layer disposed on said substrate and receiving a light beam emitted from the rear end surface of said semiconductor laser, said waveguide layer including therein a light wavefront converting element for collimating the light beam propagating in said waveguide layer emitted from the rear end surface of said laser element, a spatial light modulating element for receiving and deflecting the collimated light in response to an electrical signal, and a diffraction grating on which the light beam emerging from said spatial light modulating element is incident for directing diffracted light to said spatial light modulating element wherein light emitted from the rear end surface of said laser element and entering said waveguide layer passes along a path through said light wavefront converting element and said spatial light modulating element for selecting and guiding light of a single wavelength to said diffraction grating, and the thus selected light of a single wavelength returns from said diffraction grating along the path in an opposite direction to said semiconductor laser element, whereby light of said selected wavelength is emitted from the front end surface of said semiconductor laser element.

3. A semiconductor laser element according to claim 1 wherein light emitted from said laser element and propagating in said waveguide layer enters and emerges from said spatial light modulating element at angles satisfying the Bragg condition for said spatial light modulating element and said diffraction grating, whereby a wavelength is selected.

4. A semiconductor laser device according to claim 1 wherein the output light beam of said semiconductor laser element is emitted opposite to said waveguide layer.

5. A semiconductor laser element according to claim 1 wherein said spatial light modulating element includes means for generating a surface acoustic wave in said waveguide layer in response to a high frequency electrical signal applied to said spatial light modulating element to select an angle of emergence of the light from said spatial modulating element.

6. A semiconductor laser device according to claim 1 wherein said substrate is a piezoelectric material, such as lithium niobate.

7. A semiconductor laser device according to claim 1 wherein said waveguide layer is a piezoelectric material, such as lithium niobate into which titanium has been diffused.

8. A semiconductor laser device according to claim 1 wherein at least one of said light wavefront converting element and said diffraction grating comprises openings in said waveguide layer.

9. A semiconductor laser device according to claim 1 wherein at least one of said light wavefront converting element and said diffraction grating is formed by diffusing an impurity into said waveguide layer.

10. A semiconductor laser device according to claim 1 wherein at least one of said light wavefront converting element and said diffraction grating is formed by depositing a substrate onto a surface of said waveguide layer.

11. A semiconductor laser element according to claim 2 wherein light emitted from said laser element and propagating in said waveguide layer enters and emerges from said spatial light modulating element at angles satisfying the Bragg condition for said spatial light modulating element and said diffraction grating, whereby a wavelength is selected.

12. A semiconductor laser element according to claim 2 wherein said spatial light modulating element includes means for generating a surface acoustic wave in said waveguide layer in response to a high frequency electrical signal applied to said spatial light modulating element to select an angle of emergence of the light from said spatial modulating element.

13. A semiconductor laser device according to claim 2 wherein said substrate is a piezoelectric material, such as lithium niobate;

14. A semiconductor laser device according to claim 2 wherein said waveguide layer is a piezoelectric material, such as lithium niobate into which titanium has been diffused.

15. A semiconductor laser device according to claim 2 wherein at least one of said light wavefront converting element and said diffraction grating comprises openings in said waveguide layer.

16. A semiconductor laser device according to claim 2 wherein at least one of said light wavefront converting element and said diffraction grating is formed by diffusing an impurity into said waveguide layer.

17. A semiconductor laser device according to claim 2 wherein at least one of said light wavefront converting element and said diffraction grating is formed by depositing a substance onto a surface of said waveguide layer.

* * * * *